United States Patent
Bergmann et al.

(10) Patent No.: US 6,909,342 B2
(45) Date of Patent: Jun. 21, 2005

(54) RECURSIVE SAW-FILTER WITH A LOW CHIP LENGTH

(75) Inventors: Andreas Bergmann, Haiming (DE); Joachim Gerster, München (DE)

(73) Assignee: EPCOS AG, Münich (DE)

( * ) Notice: Subject to any disclaimer, the term of this patent is extended or adjusted under 35 U.S.C. 154(b) by 0 days.

(21) Appl. No.: 10/296,100

(22) PCT Filed: Apr. 30, 2001

(86) PCT No.: PCT/DE01/01629

§ 371 (c)(1),
(2), (4) Date: Jun. 16, 2003

(87) PCT Pub. No.: WO01/91293

PCT Pub. Date: Nov. 29, 2001

(65) Prior Publication Data

US 2004/0041666 A1 Mar. 4, 2004

(30) Foreign Application Priority Data

May 25, 2000 (DE) .......................... 100 26 074

(51) Int. Cl.⁷ ................................. H03H 9/00
(52) U.S. Cl. ..................................... 333/193; 333/194
(58) Field of Search ................. 333/193, 194, 333/195, 196; 310/313 R, 313 B, 313 C, 313 D

(56) References Cited

U.S. PATENT DOCUMENTS

| 4,599,532 | A | * | 7/1986 | Okamoto et al. | 310/313 D |
| 4,910,839 | A | | 3/1990 | Wright | |
| 5,128,640 | A | * | 7/1992 | Anemogiannis | 333/193 |
| 5,475,348 | A | | 12/1995 | Hode et al. | |
| 5,661,444 | A | * | 8/1997 | Dill et al. | 333/195 |
| 5,896,071 | A | | 4/1999 | Dai et al. | |
| 5,994,980 | A | * | 11/1999 | Tada | 333/193 |
| 6,043,726 | A | * | 3/2000 | Solal et al. | 333/195 |
| 6,344,705 | B1 | * | 2/2002 | Solal et al. | 310/313 B |
| 6,469,598 | B2 | * | 10/2002 | Tsuzuki et al. | 333/193 |
| 6,483,224 | B1 | * | 11/2002 | Kobayashi et al. | 310/313 A |
| 6,525,629 | B2 | * | 2/2003 | Matsuda et al. | 333/195 |
| 6,559,738 | B2 | * | 5/2003 | Tsuruoka et al. | 333/193 |
| 6,570,471 | B2 | * | 5/2003 | Inoue et al. | 333/195 |
| 6,710,683 | B2 | * | 3/2004 | Nakamura et al. | 333/193 |
| 6,717,489 | B2 | * | 4/2004 | Takamine | 333/193 |

OTHER PUBLICATIONS

Morgan, D.G., and Thorvaldsson, T. "A New Low–Loss Saw Filter Technique", 1994 Ultrasonics Symposium, pp. 23–26.

* cited by examiner

Primary Examiner—Michael Tokar
Assistant Examiner—Linh V Nguyen
(74) Attorney, Agent, or Firm—Schiff Hardin LLP

(57) ABSTRACT

A recursive surface-active wave filter with directed reflection is provided that such that the desired transmission behavior is modeled by superimposing the signals of three electrically interconnected individual tracks.

11 Claims, 4 Drawing Sheets

RECURSIVE SAW-FILTER WITH A LOW CHIP LENGTH

RELATED APPLICATIONS

This application is a 371 of PCT/DE01/01629 filed on Apr. 30, 2001.

BACKGROUND OF THE INVENTION

1. Field of the Invention

The invention relates to a recursive surface active wave filter having at least three tracks connected in series and/or parallel.

2. Description of the Related Art

Surface-active wave filters, also referred to as SAW filters, can, for example, be employed as intermediate frequency filters in the reception part of a mobile telephone. These filters must meet various demands, including providing an adequately broad pass-band, a high edge steepness, and a best possible selection on the smallest possible chip area.

A maximum edge steepness can be achieved with a filter having lengthened pulse response since the edge steepness is directly dependent on the length of the pulse response. In a transverse filter, the length of the pulse response is directly determined from the length of the interdigital transducers utilized for the electro-acoustic conversion. Given the specification-conditioned, maximally allowed chip length, it is therefore not possible to meet the specifications demanded for mobile telephones with a transverse filter. For this reason, technologies have prevailed in mobile telephones that use a folded propagation path of the surface-active wave. Resonance chambers are created on the surface of the filter with the assistance of reflective structures, these resonance chambers serving the purpose of achieving a greater edge steepness with the resultant lengthened pulse response. A given length of the pulse response can be utilized for achieving the most beneficial compromise between pass-band behavior (i.e., the shape of the pass region or passband) and the edge steepness and the selection (i.e., the suppression of signal in the stop band). When the first two demands are to be met by a transducer having a minimal length, then its selection is necessarily inadequate.

Surface-active wave filters that exhibit the desired transmission behavior have previously been realized with various methods. The simplest solution that, however, cannot be utilized in mobile radiotelephony is to lengthen the filter and, thus, the chip on which the filter is realized to the extent that the desired transmission behavior is achieved. A more complex and, thus, improved transmission behavior can be achieved with a longer filter. This, however, works against the desired miniaturization of the filters.

It is also possible to increase the reflections in the surface-active wave structures of the transducers or reflectors. Stronger resonances with which the duration of the pulse response is lengthened are thus generated. Given crystal substrates, however, the reflection is highly dependent on the relative layer thickness of the metallization. The necessary, intense reflection can only be achieved with a high metallization layer thickness, which, however, leads to an increased sensitivity to technology-conditioned fabrication scatter in the manufacture of the filters.

Another possibility is comprised in realizing a filter with the desired transmission behavior in a plurality of acoustic coils in which identical transducers are connected in parallel or not in parallel. The frequency-dependent reflection at the acoustic transducer ports is thereby utilized in order to additionally influence the transfer function. However, no additional degrees of freedom in the design of these filters are achieved with such a configuration. Given identical filter properties, only the demands made of the individual acoustic track can be lowered, for example with respect to the selection.

Another possibility is to use a SAW filter with exactly two different acoustic tracks in which respectively two interdigital transducers are connected in parallel both at the filter input as well as at the filter output. A greater number of degrees of freedom in the design of the filter are achieved by this. In particular, the selection of the filter is improved, this being clearly greater for the overall filter than for an individual track or for a sub-filter. Improvements in the selection of the overall filter compared to the selection of the individual tracks, however, are only achieved when the transfer functions of the two individual tracks in the stop band are of the same amount and opposite phase, since only then can unwanted signals in the stop band be quenched.

SUMMARY OF THE INVENTION

It is therefore an object of the present invention to provide an SAW filter that can realize the required demands made of the transmission behavior on a reduced chip length. The structure of the filter should be such that error tolerances in the manufacture do not lead to a deterioration of the transmission behavior of the overall filter.

This object is inventively achieved by a surface-active wave filter comprising at least three different acoustic tracks that are electrically connected in at least one of series and parallel, each track comprising at least two interdigital transducers serving as an input transducer and an output transducer; each track being a sub-filter in which a phase angle that is unequal to a multiple of 90° is set between centers of excitation and reflection; each of the individual tracks being fashioned such that a transmission behavior that is desired and that is prescribed with respect to edge steepness, pass-band and insertion attenuation first derives from a superimposition of behavior of the three acoustic tracks. Developments of the invention are described in more detail below.

The invention achieves an improved transmission behavior of the filter given a chip length that is reduced compared to the Prior Art in that at least three acoustic tracks are connected electrically in serial and/or parallel. Each track comprises at least two interdigital transducers serving as an input and output transducer that can be arranged between two reflectors in each track.

The at least three tracks are different from one another, so that the demands made of the filter transfer function can be divided onto all different tracks. The advantage derives in the circuiting of these tracks in that up to six different transducers can be arranged in the filter, and these can also solve complex optimization problems. Each acoustic track represents a sub-filter in which a phase angle that differs from 90° or a multiple thereof is set between the centers of excitation and reflection in at least one sub-filter. At least one filter is a filter with directed reflection, particularly an SPUDT filter. Each of the at least three tracks can solve one optimization problem for the filter, and the desired transmission behavior derives only in the superimposition of the signals of all three acoustic tracks due to the series interconnection of the input transducers and/or of the output transducers of the individual tracks.

The inventive interconnection of three and more tracks is advantageous compared to the known two-track solution since it is simpler to optimize in view of a desired behavior. In the two-track solution, it is necessary that the transfer functions of the two individual tracks be of the same amount and opposite phase in the stop-band. Only then to the sub-transfer functions in the stop-band cancel, and the selection is greater in the parallel circuit as well as in the series interconnection than in the individual tracks. With a given transmission behavior of a first track in the known two-track arrangement, this results in the second track no longer being freely optimized--rather it must be fashioned dependent on the properties of the first track in terms of nearly all functions.

In the region of the filter stop-band, i.e., in the stop range, this means that the amount and phase of the contribution of the second track are largely fixed with a given first track. Every deviation from this behavior dictated by the first track prevents the sum of these two complex indices from disappearing. What is understood in this context as a complex index is a vector that is defined by the amount and phase of the signal, where the complex index can be defined both in the time domain as well as in the frequency domain.

In the invention, in contrast, the third track and, potentially, the further tracks, permit the two first tracks to be designed entirely independently of one another. The third track and, potentially, the further tracks, then allow the sum of the complex indices to approach zero within the entire stop-band region.

The variation of the sub-filters or of the acoustic tracks can be undertaken in various ways. For example, it is possible to provide different interdigital transducers in the three tracks, where up to six different transducers can be present given three tracks. It is also possible to fashion the interdigital transducers only partly different.

Another possibility is to arrange an additional grid structure within at least one track, this additional grid structure having no electrical connection to one of the interdigital transducers. When the grid structure is arranged between input transducer and output transducer of a track, then it can serve as additional shielding in this track that prevents an electromagnetic cross-talk between the input transducer and output transducer and thus improves the transmission behavior further. Preferably, the grid structure is connected to ground for this purpose. Alternatively, a metallized strip can also be arranged between the transducers for shielding the electromagnetic cross-talk.

The grid structure is a regular strip structure that, for example, is arranged on a $\lambda/2$ grid. The strips arranged vertically relative to the wave propagation direction can be connected to one another or—alternatively—individual strips can also be without a mutual connection. The length of a grid structure can, for example, lie in the range of 5 through 20 wave trains, but is not limited to this length. Given a sole employment as shielding, the grid structure is preferably reflection-free. This can be achieved with a split finger structure ($\lambda/8$ or $\lambda/6$ finger).

It is also possible to arrange the grid structure between an interdigital transducer and a reflector in one or more tracks. Additional reflection centers and, thus, additional resonance chambers as well are created within the tracks with the assistance of this grid structure. Since each resonance chamber can possess its own resonant frequency, the pass-band can be influenced with the assistance of these additional resonance chambers. It is also possible to arrange more than one grid structure within a track, where the position within the track can be arbitrary. Reflective and reflection-free grid structures can also be provided together in a track.

A further variation of the individual tracks for optimizing the overall filter is comprised in selecting the aperture of the tracks to be different. By using a diminution (or enlargement) of the aperture, particularly in the third track, the necessary fine tuning for the balancing of the overall signal can, in particular, be utilized for the destructive cancellation of the complex indices in the stop region. Since the aperture is infinitely variable, the complex indices of the third track can also be correspondingly infinitely varied so that an easier balancing of the two other tracks is possible. Preferably, the aperture of one track is varied when the two other tracks already exhibit a far-reaching approach to the desired transmission behavior so that only the final fine tuning need be undertaken with the assistance of the third track. For that purpose, the aperture is usually made smaller compared to the other two tracks. Fundamentally, however, it is also possible to vary the aperture in all tracks so that all tracks can comprise different apertures.

Another possibility for the inventive variation of the track and, thus, of the filter properties is to set the spacing of the excitation and reflection centers between the input transducer and the output transducer of a track to a value that differs from the spacing in a further track by a value that is not a multiple of the half wavelength. In this way, it is possible to design the in-phase and quadrature components of the pulse response independently of one another. With a given design of the interdigital transducers, the variation possibility is then comprised in a variation of the spacing of input transducer and output transducer from one another. For example, what is a smaller difference of the transducer spacings results in that that a track with lower excitation or reflection does not necessarily derive given the necessity of a small quadrature component. The independent design of the in-phase component and the quadrature component of the pulse response also makes it possible to design asymmetrical transfer functions for the overall filter, whereas the transfer functions of the individual tracks are respectively symmetrical relative to their center frequencies.

When the phase angle between the excitation center and the reflection center of a SPUDT cell amounts to 45°, then this leads to an electro-acoustic conversion, i.e., to a transmission curve, that is symmetrical relative to the center frequency. When the phase angle deviates from this value, then one edge of the pass-band is formed steeper than the other edge due to the arising asymmetry.

An inventive interdigital transducer contains at least one SPUDT cell, but preferably a plurality of SPUDT cells with identical phase angle.

In one embodiment of the invention, at least one sub-filter comprises SPUDT cells with a phase angle of $45°+z\cdot 90°$ between the excitation center and the reflection center, where z is a whole number, making this is a matter of a classic SPUDT (sub-) filter.

When, given the inventive filter, the phase angles in two tracks are set such that respectively different edges of the pass-band are designed steeper in the transmission behavior of the individual track, then addition of these two signals yields a pass-band that is steeper at both edges than would be possible with a uniform phase angle of 45°. Moreover, a phase angle deviating from 45° makes it possible to likewise design an asymmetrical transfer function for the overall filter without having to vary the transducer spacings for this purpose. An asymmetrical transfer function of the overall filter is then already enabled with a single track.

Another variation possibility of an inventive transducer is to design the center frequency of the interdigital transducers differently in the individual tracks. As a result of the offset of the center frequencies that is achieved by this, a broader pass-band and, thus, a larger pass range is obtained.

When all tracks are connected parallel, then it is not necessary to connect the individual tracks to separate terminal pads. On the contrary, it is possible to individually connect the electrode fingers of interdigital transducers of two tracks neighboring one another in transverse direction to one another. When the connection sequence of the electrode fingers in a plurality of tracks is coincident, then it is also possible to connect the fingers of a plurality of neighboring tracks to one another.

Despite connected electrode fingers, it is possible to undertake corresponding variations of the individual tracks that lead to the inventively optimized transmission behavior of the overall filter. When the electrode fingers of an interdigital transducer are connected to the electrode fingers of the interdigital transducer of the neighboring track directly adjacent in a transverse direction, then it is possible to connect the electrode fingers of the remaining other transducers in a traditional way. In this way, two different connection possibilities for the interdigital transducers in the filter or in individual tracks can be established.

The connection of electrode fingers of interdigital transducers neighboring one another in different tracks does not require identical finger arrangements but only identical finger connection sequences. When the electrode fingers in the neighboring interdigital transducers are on grids that are of different size or shifted relative to one another, then the electrode fingers of the neighboring interdigital transducers can nonetheless be connected to one another. The connection then ensues in a transition region in which the finger connection pieces no longer need to run parallel to one another and not vertically to the wave propagation direction.

Given interdigital transducers having a different grid or different finger period and, accordingly, a different center frequency, it is possible to make the apertures of the individual tracks smaller and smaller but to correspondingly increase the plurality of tracks so that the sum of the apertures for the overall filter remains unmodified or nearly unmodified. When the aperture of the individual track approaches zero, then an interdigital transducer with infinitely many tracks is obtained in this way that, as viewed in transverse direction, comprises a continuous variation of the finger spacing (grid) or of the center frequency. Such an interdigital transducer, which is also known as FAN transducer, has the advantage of an enhanced bandwidth of the pass-band. Inventively, one or more interdigital transducers can be replaced by FAN transducers.

It is also possible, however, to implement a plurality of interdigital transducers of tracks neighboring one another in the form of a single interdigital transducer extending over a plurality of tracks that is shared by all tracks and that can also be implemented as a FAN transducer. Such a transducer can replace some of the interdigital transducers or, potentially, all interdigital transducers of the input or output. However, it is also possible to combine a shared transducer, which represents the input or output transducer of the inventive filter, with a plurality of smaller transducers or transducers with smaller aperture corresponding in number to the plurality of individual tracks as an output transducer or input transducer.

DESCRIPTION OF THE DRAWINGS

The invention is explained in greater detail below on the basis of exemplary embodiments and the appertaining Figures.

DETAILED DESCRIPTION OF THE INVENTION

Figure 1A:
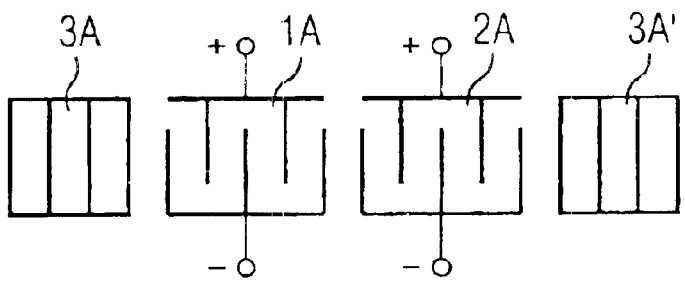
FIG. 1 is a schematic illustration of an inventive surface-active wave filter with three tracks.
Figure 1B:
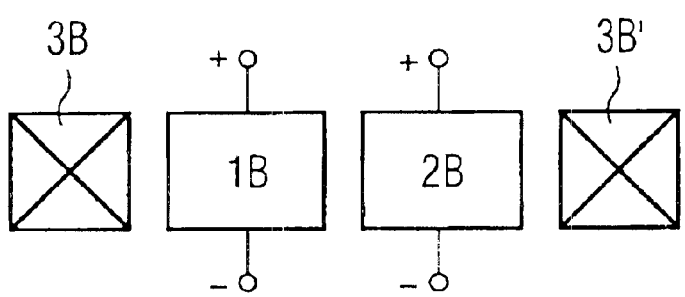
Figure 1C:
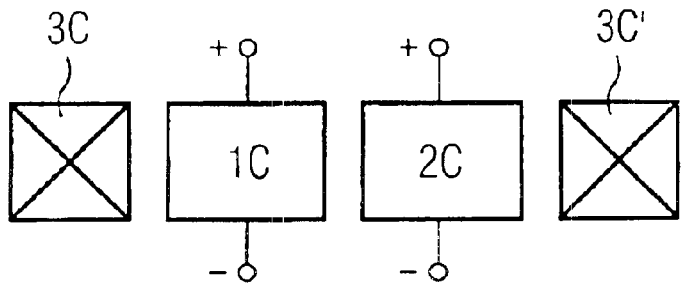

FIGS. 1A, 1B and 1C show a schematic illustration of an inventive filter with three tracks A, B and C connected in parallel. Each track comprises an input transducer 1 and an output transducer 2 that can be arranged between two reflectors 3 and 3', as shown in the Figures. The electrode strips or the electrode fingers of the interdigital transducers 1, 2 and of the reflectors 3 are shown by way of suggestion for the track A. The specific design of the interdigital transducers is not shown, the excitation centers and the reflection centers in them not coinciding and comprising a phase angle of, for example, 45°. Such interdigital transducers, however, are known as SPUDT transducers or transducers with directed reflection. Given phase angles deviating from 45° that lie between 0 and 180°, one does not speak of SPUDT transducers but of transducers with directed reflection.

One of the possible interconnections of the interdigital transducers is illustrated by indicating the corresponding operational sign at the busbars of the interdigital transducers. However, the terminals can also be arranged such that the terminals between pairs of tracks have the respectively same polarity so that they can be connected to a common pad. A second pad between respectively two tracks is thus saved and the wiring outlay is reduced. However, it is also possible to serially connect all or some of the input transducers to one another, and the output transducers likewise. One transducer can be arranged parallel to a series circuit of two other transducers. The potentially existing reflectors 3 can be connected to ground but can also be fashioned as "floating reflectors".

These interdigital transducers can be operated symmetrically or asymmetrically. Given symmetrical operation, electrical signals having opposite phase are applied to the terminals referenced plus and minus. Given asymmetrical operation, the signal is only applied to one terminal, whereas the other lies at a fixed potential, usually ground. For parallel connection of the three tracks, the input transducers 1 are connected in parallel and connected to the input; the output transducers 2 are likewise connected in parallel and connected to the output.

Figure 2:
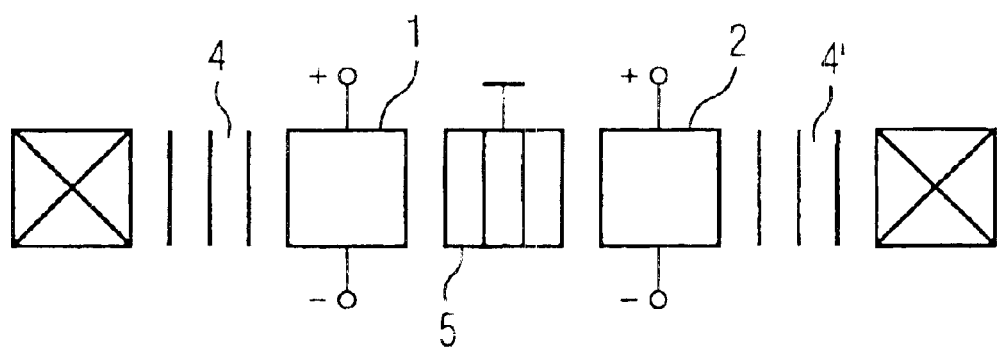
FIG. 2 is a schematic layout showing an individual track with additional grid structures.

FIG. 2 shows a schematic illustration of an individual track in which additional grid structures 4 and 5 are arranged between the filter structures. What inventively applies is that at least one grid structure can be arranged in at least one track. For the sake of simplicity, a plurality of grid structures with their possible positions are simultaneously arranged in the track. However, it is also possible to arrange more or fewer grid structures in the track. The grid structure 5 is preferably reflection-free and represents an additional electromagnetic shielding between the interdigital transducers 1 and 2.

It is also possible to replace the grid structure 5 with a metallization strip, a "runner". A reflection-free grid structure is obtained when a reflection-free combination of electrode strips is employed, for example λ/8 wide strips at a spacing of λ/8. Freedom from reflection arises by destructive interference of, for example, two partial reflections phase-shifted by 180°, which corresponds to a λ/4 spacing of the strip centers. However, it is also possible to fashion the grid structure 5 reflective, where new resonance chambers can form between the individual filter structures. In addition to the function as reflective element, the grid structure 5 can also be connected to ground and additionally contribute to the electromagnetic shielding. The grid structures 4 are arranged between the input and output transducers and the respectively neighboring reflectors and serve only for producing additional resonance chambers. The electrode strips of these grid structures can be connected to one another and be applied to ground; however, it is also possible—as shown in FIG. 2—to select individual electrode strips that are not connected to one another as grid structures.

Figure 3A:
FIG. 3 is a schematic layout showing a three-track surface-active wave filter in which different spacings between input and output transducer are selected in the tracks.
Figure 3B:
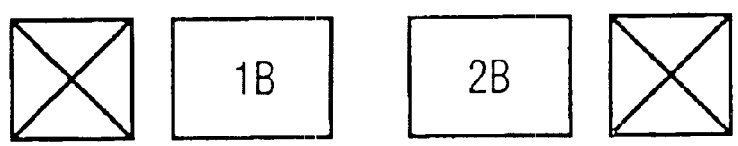
Figure 3C:

FIG. 3 shows a schematic illustration of three individual tracks connected in parallel to one another in which the individual tracks A, B and C differ in that the spacing between input transducer 1 and output transducer 2 differs in the individual tracks. In addition, the overall track length varies in the three tracks.

Figure 4:
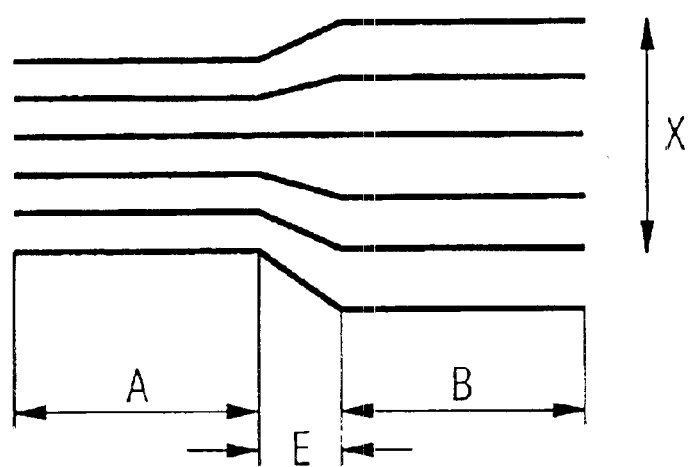
FIG. 4 is a pictorial layout showing portions of electrode fingers of two neighboring interdigital transducers that are connected to one another.

FIG. 4 excerpts a region of an inventive filter in which the electrode fingers of two interdigital transducers arranged in neighboring tracks are individually connected to one another. Track A and track B differ from one another in terms of their finger period, this rising from track A to track B. In a transition region E, the connecting pieces between the individual electrode fingers are no longer arranged vertical to the propagation direction x of the surface-active wave but obliquely to it in order to adapt to the different grids (finger periods) of the different tracks. For the sake of clarity, the difference in the finger period is shown exaggerated in the Figure. The corresponding finger connection sequence is not shown, this, for example, being potentially alternating in this region of the interdigital transducer.

Figure 5:
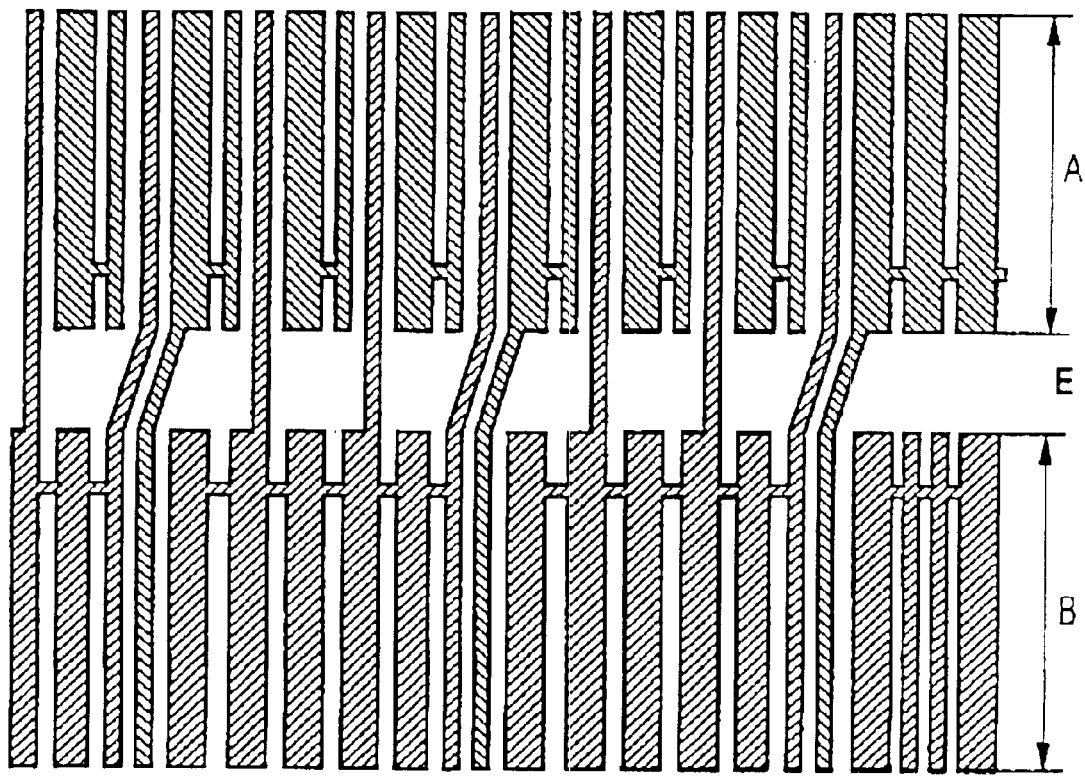
FIG. 5 is a pictorial layout showing two interdigital transducers with connected electrode fingers in which different finger periods are selected in the two tracks.

FIG. 5 shows an excerpt from an inventive surface-active wave filter in which the electrode fingers of two interdigital transducers lying next to one another in neighboring tracks are individually connected to one another. Differing from the arrangement according to FIG. 4, the two tracks A and B comprise the same finger period here. Reflective fingers are arranged here next to the exciting fingers, where the arrangement is such that the illustrated structures comprise a directed reflection. The electrode fingers shown dark, for example, can be connected to an upper busbar, the electrode fingers shown lighter can be connected to a busbar residing at the bottom. No separate busbars for the connection of the electrode fingers are therefore required between the two tracks. FIG. 5 also shows that, given different finger connection sequence, individual electrode fingers of interdigital transducers neighboring one another in different tracks can nonetheless be individually connected to one another, this being enabled by the transition region E in which the connecting pieces between the electrode fingers of different interdigital transducers can proceed obliquely relative to the propagation direction of the surface-active wave.

Figure 6:
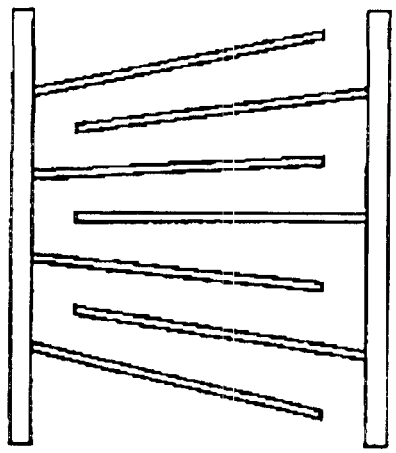
FIG. 6 is a pictorial layout showing an interdigital transducer with a continuously varying finger period.

FIG. 6 shows a "FAN transducer" that is fundamentally composed of what could potentially be an infinite number of juxtaposed tracks in which the electrode fingers of neighboring tracks are connected to one another. The finger period and, thus, the center frequency of these many tracks rises continuously from the one side of the transducer to the other. Since the structure represents a parallel circuit of potentially infinitesimally narrow sub-tracks, an overall transducer or an SAW filter is obtained that has an enhanced bandwidth compared to an SAW filter in which the tracks comprise uniform center frequencies.

Figure 7:
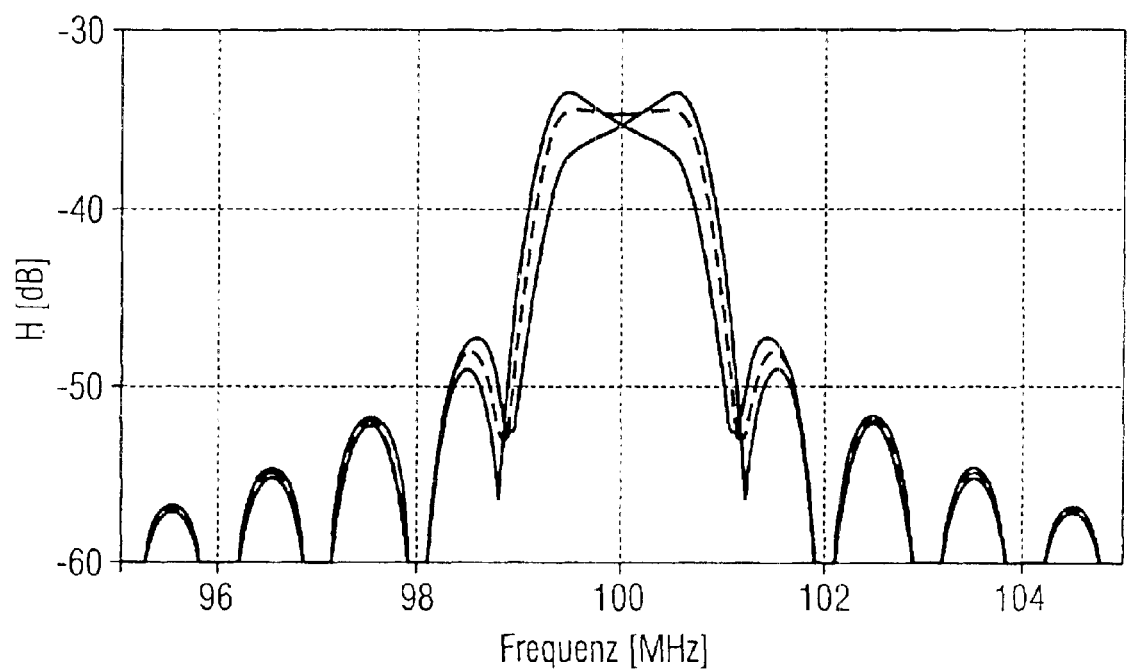
FIG. 7 is a graph showing the transmission behavior of individual tracks with a different phase angle between excitation and reflection.

FIG. 7 shows the curves for the transmission behavior of three acoustic tracks in which different phase angles are set between the excitation and reflection centers of the interdigital transducers. Given a phase angle deviating from 45°, a transmission curve is obtained that comprises an asymmetrical pass-band. As a significance difference, one edge at the pass-band drops off more steeply, whereas the other drops off flatter. Three transmission curves are shown in FIG. 7 in which phase angles of 25, 45 and 65° are set in the transducers. Bu superimposing these three signals in the parallel circuit, an overall transmission behavior is obtained that is again symmetrical relative to the center frequency. The more steeply set edges of the arrangements having a phase angle deviating from 45° are also preserved on the superimposition.

Figure 8:
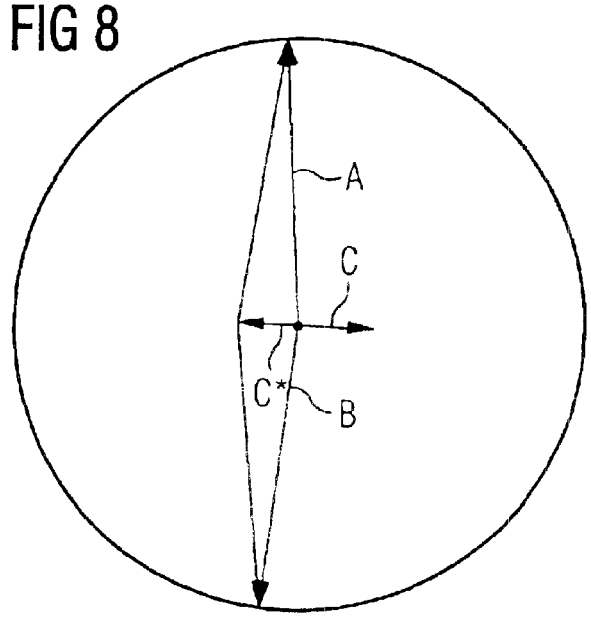
FIG. 8 is an index diagram as a simplified illustration for the signal addition in the filter.

FIG. 8 shows a two-dimensional index diagram in which each arrow stands for a complex index that is characterized by amount and phase at a specific frequency. The vectors allocated to the individual tracks A, B and C are selected such that they approach zero when added. For this frequency, the three tracks would then yield an extinction of the signal, i.e., a maximum attenuation. It also becomes clear from FIG. 8 that such an extinction can be more simply achieved with the assistance of three vectors or with the assistance of three tracks than would be the case with two tracks. The vectors A and B that are greater in terms of amount are selected such that they nearly compensate in the addition. The remaining amount is compensated in a simple way with the assistance of a suitably selected, third vector C. Due to the smaller amount to be compensated, the residual compensation is simpler to set, particularly since it is not absolutely necessary that the value 0 be obtained. It suffices to select the third vector C such that the result, i.e., the addition of the three vectors, yields an amount that lies below a prescribed limit value. For example, this allows the phase of the vector C to be set only approximately and to then undertake the fine tuning via the amount. The amount in the surface-active wave filter can then be set via a variation of the aperture.

The invention is presented here on the basis of only a few exemplary embodiments and, of course, is not limited to these. On the contrary, it is possible to vary a number of parameters. It is also possible to combine the variation possibilities shown in the various Figures and to thereby create more complex surface-active wave filters. The invention is also not limited to a surface-active wave filter with three tracks. On the contrary, the invention also allows surface-active wave filters having a higher number of tracks to be manufactured. As a result of the parallel or series circuit of three and more tracks and the superimposition of the signals from the individual tracks that is thus obtained, a more complex transmission behavior of the surface-active wave filter can be inventively presented. Given a shortening of the track length, a desired transmission behavior that meets these demands/specifications of the mobile radiotelephone system can nonetheless be obtained overall despite deteriorated properties of the individual track. The particular implementations shown and described herein are illustrative examples of the invention and are not intended to otherwise limit the scope of the invention in any way. For the sake of brevity, conventional electronics may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

what is claimed is:

1. A surface-active wave filter, comprising:
   at least three different acoustic tracks that are electrically connected in at least one of series and parallel, each track comprising at least two interdigital transducers serving as an input transducer and an output transducer, wherein at least one interdigital transducer in one of the tracks differs in design from at least one interdigital transducer in an other of the tracks;

each track being a sub-filter in which a phase angle that is unequal to a multiple of 90° is set between centers of excitation and reflection;

each of the individual tracks being fashioned such that a transmission behavior that is desired and that is prescribed with respect to edge steepness, pass-band and insertion attenuation first derives from a superimposition of behavior of the three acoustic tracks.

2. The surface-active wave filter according to claim 1, wherein at least two interdigital transducers in the different tracks are constructed different from one another.

3. The surface-active wave filter according to claim 1, further comprising:

a reflector; and an additional grid structure or a metallized runner that is not electrically connected to an input transducer or output transducer, the additional grid structure being arranged within at least one track between the two interdigital transducers or between an interdigital transducer and the reflector.

4. The surface-active wave filter according to claim 1, wherein the grid structure or the metallized runner is connected to ground, is fashioned reflection-free and is arranged between the input and the output transducer.

5. The surface-active wave filter according to claim 1, wherein apertures of at least two of the acoustic tracks are different from one another.

6. The surface-active wave filter according to claim 1, wherein spacings of excitation centers and reflection centers between the input and the output transducer are different in the acoustic tracks.

7. The surface-active wave filter according to claim 1, wherein more than three acoustic tracks are circuited serially, in parallel, or partly serially and partly in parallel.

8. The surface-active wave filter according to claim 1, wherein:

at least some of the acoustic tracks are arranged parallel to one another on a chip;

at least two interdigital transducers from tracks neighboring one another are arranged neighboring one another; and electrode fingers from both interdigital transducers are individually connected to one another extending over tracks.

9. The surface-active wave filter according to claim 1, wherein the interdigital transducers in the different tracks comprise a different distribution of excitation and reflection.

10. The surface-active wave filter according to claim 9, wherein phase angles deviating from 45° are set between excitation and reflection such that that respectively different edges of a pass-band are set more steeply in the individual tracks than given a uniform phase angle of 45° and corresponding symmetrical transmission behavior.

11. The surface-active wave filter according to claim 1, wherein a center frequency is different in the different tracks.

* * * * *